United States Patent [19]

Happ et al.

[11] Patent Number: 5,743,706
[45] Date of Patent: Apr. 28, 1998

[54] METHOD OF AND APPARATUS FOR AUTOMATIC HANDLING OF TEST PIECES

[75] Inventors: Christian Happ, Mondfeld; Rudolf Geier, Külsheim-Hundheim, both of Germany

[73] Assignee: atg test systems GmbH, Wertheim, Germany

[21] Appl. No.: 632,777

[22] Filed: Apr. 15, 1996

[30] Foreign Application Priority Data

Apr. 15, 1995 [DE] Germany .................. 195 14 163.6

[51] Int. Cl.⁶ .................................................. B65G 59/04
[52] U.S. Cl. ................ 414/797; 414/788.7; 414/795.7; 414/796.6; 414/908
[58] Field of Search ................ 414/786, 795.7, 414/796.6, 797, 908, 788.7

[56] References Cited

U.S. PATENT DOCUMENTS

| | | |
|---|---|---|
| 1,924,908 | 8/1933 | Broadmeyer . |
| 4,676,710 | 6/1987 | Shiraishi ............... 414/908 X |
| 5,101,546 | 4/1992 | Otani et al. ............. 414/796.6 X |
| 5,355,579 | 10/1994 | Miyasaka et al. ......... 414/788.7 X |

FOREIGN PATENT DOCUMENTS

| | | |
|---|---|---|
| 2840677 | 2/1980 | Germany . |
| 3-147626 | 6/1991 | Japan ..................... 414/908 |
| 4-37195 | 2/1992 | Japan ..................... 414/795.7 |
| 2119761 | 11/1983 | United Kingdom . |
| 2213474 | 8/1989 | United Kingdom . |

*Primary Examiner*—Janice L. Krizek
*Attorney, Agent, or Firm*—Anderson, Kill & Olick, P.C.

[57] ABSTRACT

The present invention relates to a method of and an apparatus for handling test pieces in which a stack of test pieces is formed on a lift table of the apparatus and are brought into a predetermined position by a slide, which displaces the test pieces horizontally against a guide bead, with the test pieces being lifted-off the stack and transported to a test position by a first transporter having replaceable test piece-specific holding and positioning elements, and with the test pieces being transported from the test position to a storing position by a second transported having replaceable test piece-specific holding elements.

3 Claims, 4 Drawing Sheets

METHOD OF AND APPARATUS FOR AUTOMATIC HANDLING OF TEST PIECES

BACKGROUND OF THE INVENTION

The present invention relates to a method of and an apparatus for handling generally electrically to-be-tested test pieces, in particular, plate-shaped articles and, more particularly, printed circuit boards.

Generally, various methods and apparatuses for handling of electrically to-be-tested printed circuit boards are well known. However, all of them need be improved with regard to their output, operational reliability, and costs. With the conventional methods and apparatuses, a reliable separation of individual printed circuit boards and their transportation to a test apparatus present serious problems.

Furthermore, retooling of the known apparatuses for handling a different type of a printed circuit board is a time-consuming and, therefore, an expensive operation.

Accordingly, an object of the present invention is a method of and an apparatus for handling test pieces which would insure a reliable separation of individual printed circuit boards and their transportation to the test position.

Another object of the invention is a test piece handling apparatus which can be easily and quickly retooled for handling of printed circuit boards of a type different from the type of previously handled printed circuit boards.

SUMMARY OF THE INVENTION

These and other objects of the invention, which will become apparent hereinafter, are achieved by providing a method in which a test piece is displaced relative to an adjacent test piece located immediately below, an uppermost test piece is brought into a predetermined position, is then lifted off the stack of test pieces and brought in a test position and, after testing, is brought in a storing position. The apparatus according to the invention includes a slide for displacing the test pieces relative to each other and two transporters for displacing a test piece to a testing position and, after testing, to a storing position, respectively.

The displacing of the test pieces relative to each other permits the elimination of the adhesion or bonding of test pieces to each other which facilitate the separation of the individual test pieces. The inventive method and apparatus permits the handling of test pieces. The inventive method and apparatus boards, having different thicknesses. Advantageously, the test pieces are shifted individually a small distance.

The uppermost test piece of a stack of pieces is brought into a predetermined horizontal position which insures its easy lifting and transporting to the test position, from which, after testing, it is brought into a storing position.

Preferably, the uppermost test piece, before being lifted off the stack, is brought into a second adjusted position. Thus, a two-stage adjustment of a lift-off position of the test piece takes place, namely rough and fine adjustments of the uppermost test piece takes place. Advantageously, at the test position, a fine adjustment of the tested test piece again takes place, which permits to obtain reliable test results of the test piece.

According to a further development of the invention, after lifting-off of the uppermost test piece, the test piece located immediately below is brought into its lift-off position by lifting the table on which the stack of test pieces is formed.

The displacing slide acts on side surfaces of the stacked test pieces, horizontally displacing them against a stop which, advantageously, has a height-dependent profile corresponding to the slide profile. The reciprocating movement of the slide insures its multiple action on each test piece, providing for stepwise shifting of each test piece toward the stop.

The first transporter has holding and positioning or locating elements which correspond to a particular type of test pieces being tested. The holding and positioning elements are easily and quickly replaceable, permitting to reduce the set-up time. The two transporters generally operate simultaneously, with the time of displacement of a test piece from the stack to the test position and the time of displacement of a test piece from the test position to a storing position being the same. This substantially increases the output capacity of the inventive apparatus.

BRIEF DESCRIPTION OF THE DRAWINGS

The features and objects of the present invention will become more apparent, and the invention itself will be best understood from the following detailed description of the preferred embodiments when read with reference to the accompanying drawings, wherein:

FIG. 1b shows schematically a plan view of the apparatus shown in FIG. 1a;

DETAILED DESCRIPTION OF THE PREFERRED EMBODIMENT

Figure 1A:
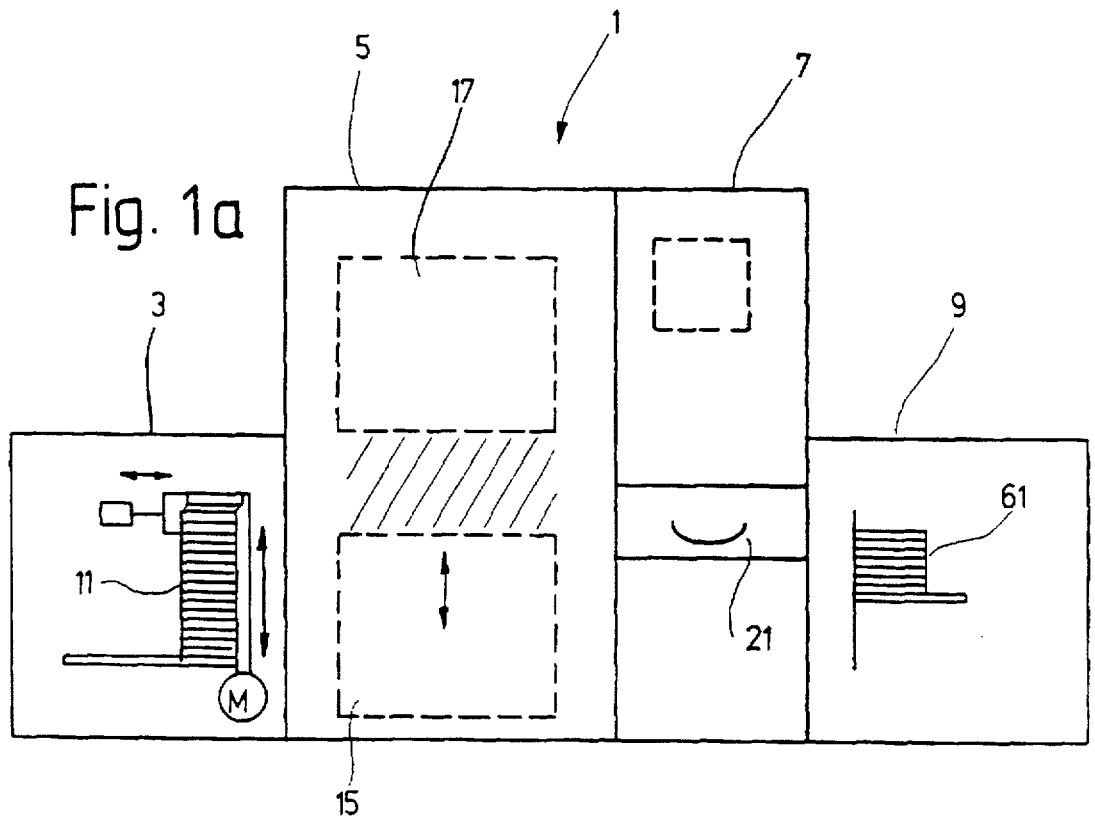
FIG. 1a shows schematically a side view of the handling apparatus according to the present invention.

An apparatus 1 for handling electrical test pieces according to the present invention, which is shown in FIG. 1, has essentially four regions 3, 5, 7 and 9. The electrically to-be-tested pieces, preferably printed circuit boards, are first brought into the entrance region 3 and are retained there. The delivery of the printed circuit boards to the apparatus 1 is effected either in stacks or separately, with the stack being formed in the region 3.

Figure 1B:
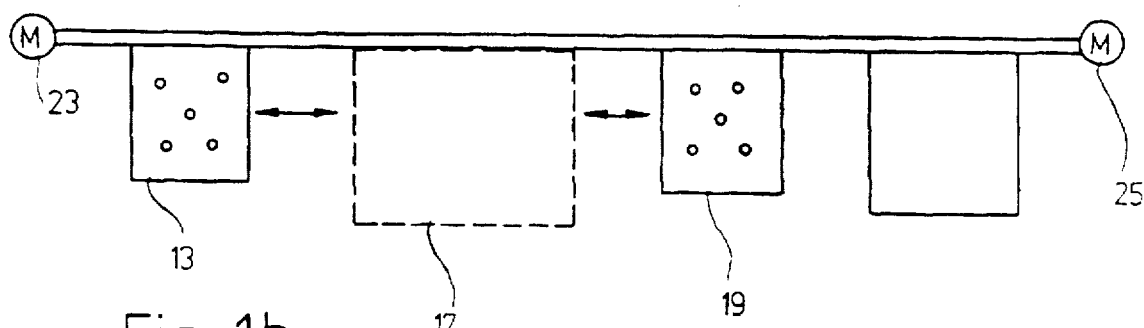

A transporter 13, which is schematically shown in FIG. 1b, lifts the uppermost printed circuit board and transports it to the following test region 5. Two test adapters 15 and 17 are provided in the test region and are associated, respectively, with the bottom and top surfaces of the printed circuit board.

As the adapter 15 and 17, a needle adapter, pin converter, or rubber converter can be used. A combination of different test adapters can also be used.

As soon as the electrical testing of the printed circuit board is completed, a second transporter 19 picks up the tested printed circuit board and transports it in the following storing region 7. If a defect has been found in the printed circuit board during testing, the second transporter 19 deposits the printed circuit board in so-called "Defect Box" 21 of the storing region 7. If the printed circuit board passes the test, it is transported further in the storing region 9. In the storing region 9, the separate printed circuit boards are again stacked. Then, the tested circuit boards are transported in a simple manner to, e.g., an automatic placement machine.

Each of the transporters 13 and 19 is equipped with its own motor 23 and 25, respectively. A respective motor is connected with a respective transporter, e.g., with a belt transmission.

The two transporters 13 and 19 so cooperate with each other that when a to-be-tested printed circuit board is transported from the stack 11 in the entrance region 3 to the testing region 5, the already tested printed circuit board is transported to the storing region 7 or 9. Thereby, the output is increased, with the idle time between testings being reduced.

Figure 2A:
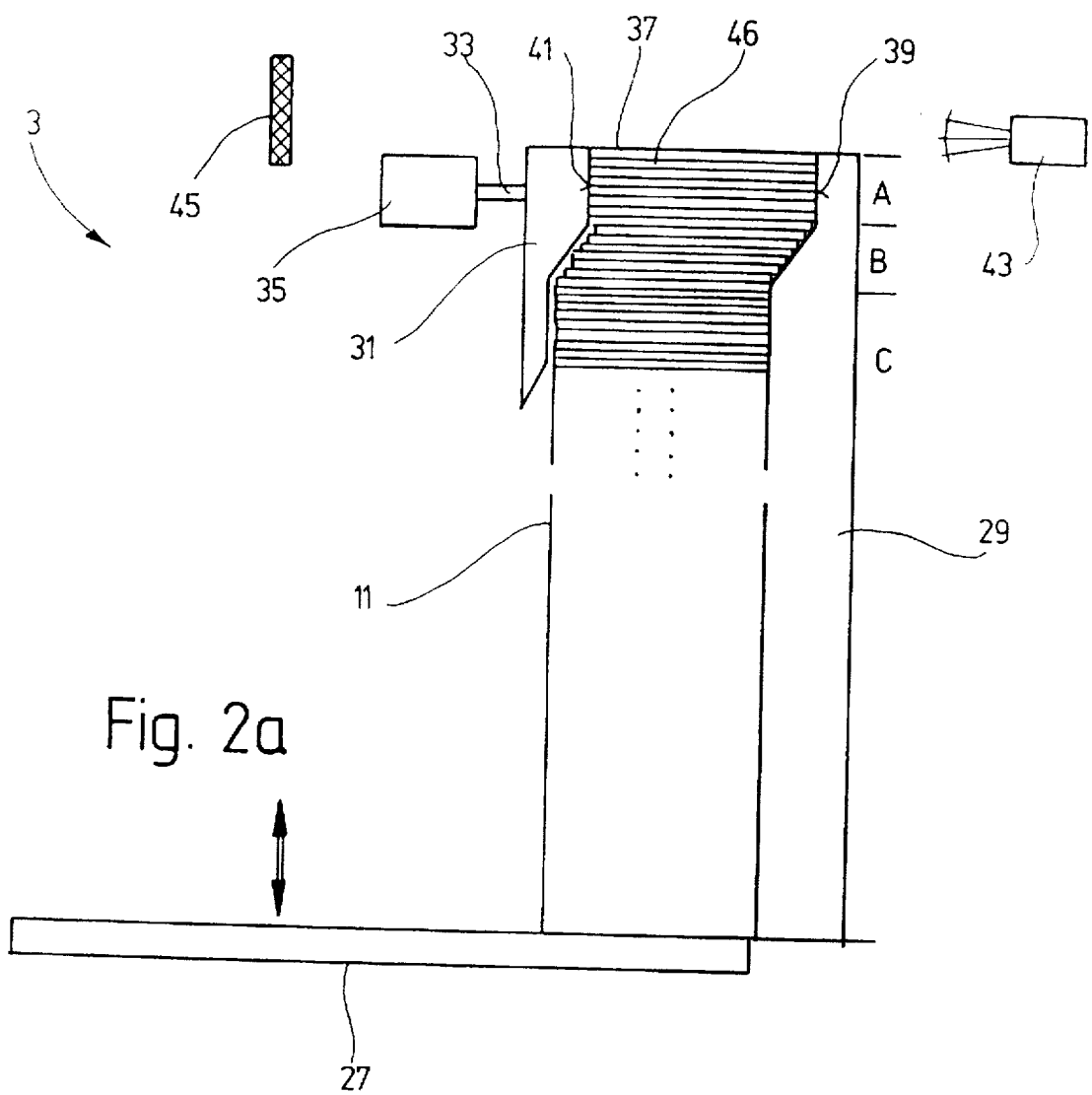
FIG. 2a shows a cut-out view of the handling apparatus according to the present invention.

Now, the entrance region 3 will be described in more detail with reference to FIG. 2a. The stack 11 of the printed circuit boards is supported on a lift table 27 vertically displaceable by an appropriate drive (not shown). The printed circuit boards forming the stack 11 are supported by a guide bead 29. In the embodiment shown in FIGS. 2a, 2b, the guide bead 29 engages only one edge of a printed circuit board of the stack 11.

In the upper region of the stack 11, a slide 31 is arranged opposite the guide bead 29. A rod 33 connects the slide 31 with a cylinder 35 which, upon being actuated, reciprocates the slide 31 with a frequency, preferably, of one cycle/sec.

Upon displacement, the slide 31 engages an adjacent edge of the printed circuit board, which is located in the operational region, and pushes it toward the guide bead 29. Dependent on the dimensional accuracy of their dimensions, the printed circuit boards engage the guide bead 29 more or less closely. Thus, the printed circuit boards, after being displaced by the slide 31, are roughly aligned.

To facilitate the separation of the upper printed circuit board 37 from the stack 11 upon lifting of the upper printed circuit board 37, the side surface 39 of the guide bead 29, which is adjacent to the printed circuit boards, has a corresponding profile. Thus, the side surface 39 is offset rearward in its upper region A with respect to its lower region C, with a continuous transition region B extending therebetween.

The inner surface 41 of the slide 31 has a profile representing a negative mirror image of the opposite side surface 39 of the guide bead 29. Thereby, the horizontal distance between the inner surface 41 of the slide 31 and the side surface 39 of the guide bead 29 remains substantially constant in the operational region of the slide 31.

In addition, in the upper region of the stack 11, there is provided a light barrier formed of a light source/sensor assembly 43 which cooperates with a reflector 45. The light emitted from the assembly 43 falls on the reflector 45 and is reflected back toward the assembly 43, where the reflected light is detected. The light barrier is oriented in such a way that it permits to determine whether the upper printed circuit board is in a correct position. As soon as the printed circuit board is lifted by the transporter 13 and is transported to the test region 5, the assembly 43 actuates the drive of the lift table 27 which moves upward until the following printed circuit board 46 is in the upper lift-off position.

After each lifting of stack 11, the printed circuit boards lose the contact with the side surface 39 of the guide bead 29. Only, after the following stroke movement of the slide 31, a respective printed circuit board will contact the side surface 39. An appropriate profile of the side surface 39 in its region B reliably ensures that the two printed circuit boards, which lie one above the other, can be displaced relative to each other. Thereby, an adhesive binding of two adjacent printed circuit boards is eliminated, providing for unhindered lifting off of the upper printed circuit board 37 without dragging of the below lying printed circuit board 46. The separation of the printed circuit boards does not depend on their thickness.

Figure 2B:
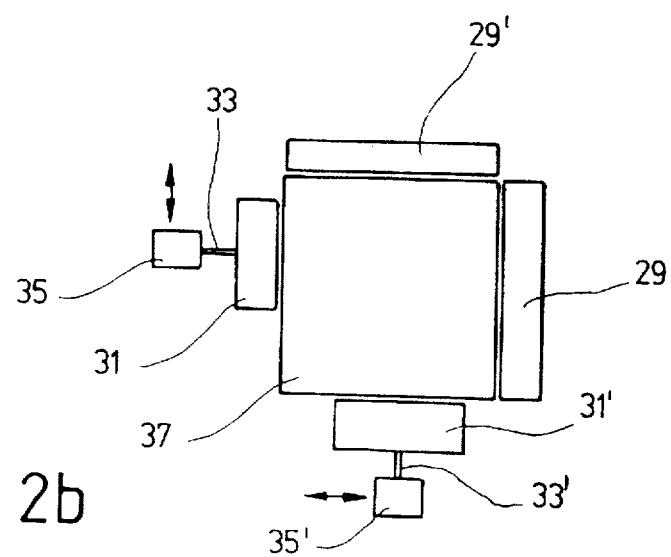
FIG. 2b shows a plan view of a slide arrangement of a handling apparatus according to the present invention.

FIG. 2b shows a further assembly of slide 31', rod 33', and cylinder 35'. The auxiliary slide 31' is arranged at an angle of 90° to the slide 31 and cooperates with an opposite guide bead 29' which is also arranged at an angle of 90° to the guide bead 29. Functionally, the assembly of the slide 31', rod 33' and cylinder 35' operates in the same way as the assembly of the slide 31, rod 33, cylinder 35. However, the guide bead 29' does not have a height-dependent changing profile of its side surface.

The arrows in FIG. 2b indicate the displacements of the assembly of the slide 31, rod 33, and the cylinder 35 and the assembly of the slide 31', rod 33', and the cylinder 35'.

The lifting of the upper printed circuit board 37 off the stack 11 and its transporting to the test region 5 will now be described in detail with reference to FIGS. 3a–3c.

The transporter 13, which effects the lifting of the upper printed circuit board and its transporting to the test region 5, includes a transporting plate 47, positioning mandrels 49 (a spring-biased positioning pin), and vacuum suction members 51. Both the positioning mandrel 49 and the vacuum suction member 51 are displaced vertically with respect to the transporting plate 47 so that a portion of each projects above the upper surface of the transporting plate. The positioning mandrels 49 are spaced from each at a larger distance than the vacuum suction members 51. Each of the positioning mandrels 49 and each of the vacuum suction members 51 is provided with a spring which insures proper positioning.

The positioning mandrels 49 and the suction members 51 are arranged on the transporting plate 47 dependent on the dimensions of the printed circuit boards which are subjected to testing. The positioning mandrels 49 should cooperate with the holes 55 in the printed circuit board, while the suction members 51 need only to be drawn to the printed circuit board regions which have no holes at all or very few.

For lifting the upper printed circuit board 37, the transporting plate 47 is brought above the printed circuit board 37 and then is lowered onto it. When the transporting plate 47 is lowered onto the printed circuit board 37, the tips of the positioning mandrels 47 engage into the holes 55. Due to the conical shape of the tips of the positioning mandrels 49 and to the correspondence of the hole diameter to the diameter of the positioning mandrel 49, the printed circuit board is brought into a predetermined position with respect to the transporting plate 47. Upon adjusting the position of the printed circuit board relative to the transporting plate 47, the suction members 51 are actuated, attracting the printed circuit board and displacing it against the spring force of the springs 53 of the mandrels 49. Then, the transporting plate 47 is lifted, together with the printed circuit board 37, as shown in FIG. 3b.

As soon as the upper printed circuit board 37 is lifted off the stack 11, the sensing assembly 43 actuates the drive of the lift table 27 to move the immediately below printed circuit board 46 into the position previously occupied by the printed circuit board 37.

Figure 3A:
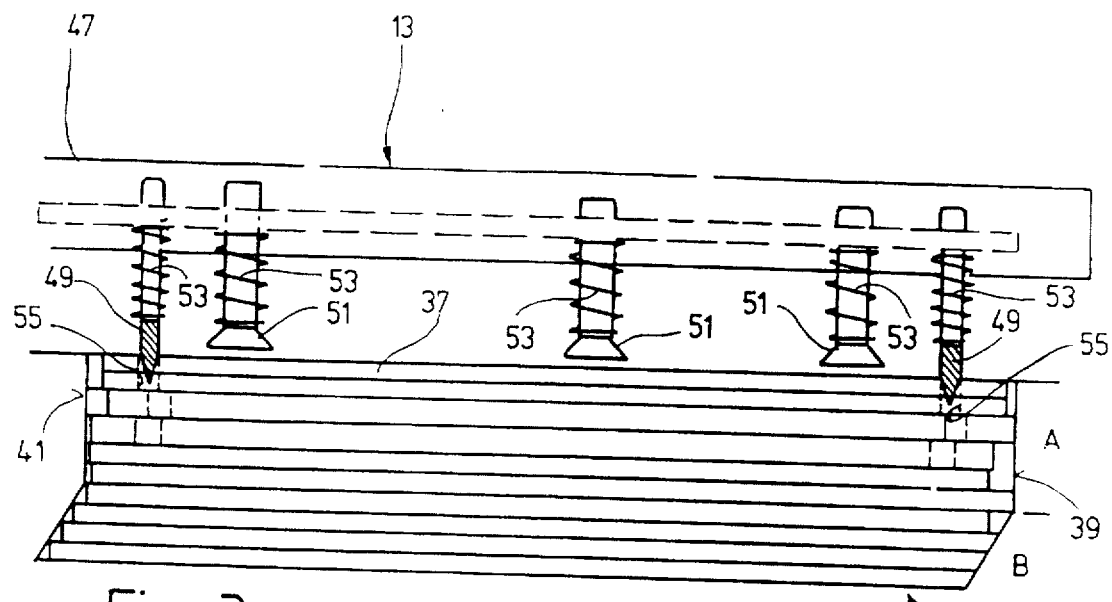
FIGS. 3a–3c show a cut-out view of a transporter used with the handling apparatus according to the present invention in three different positions.
Figure 3B:
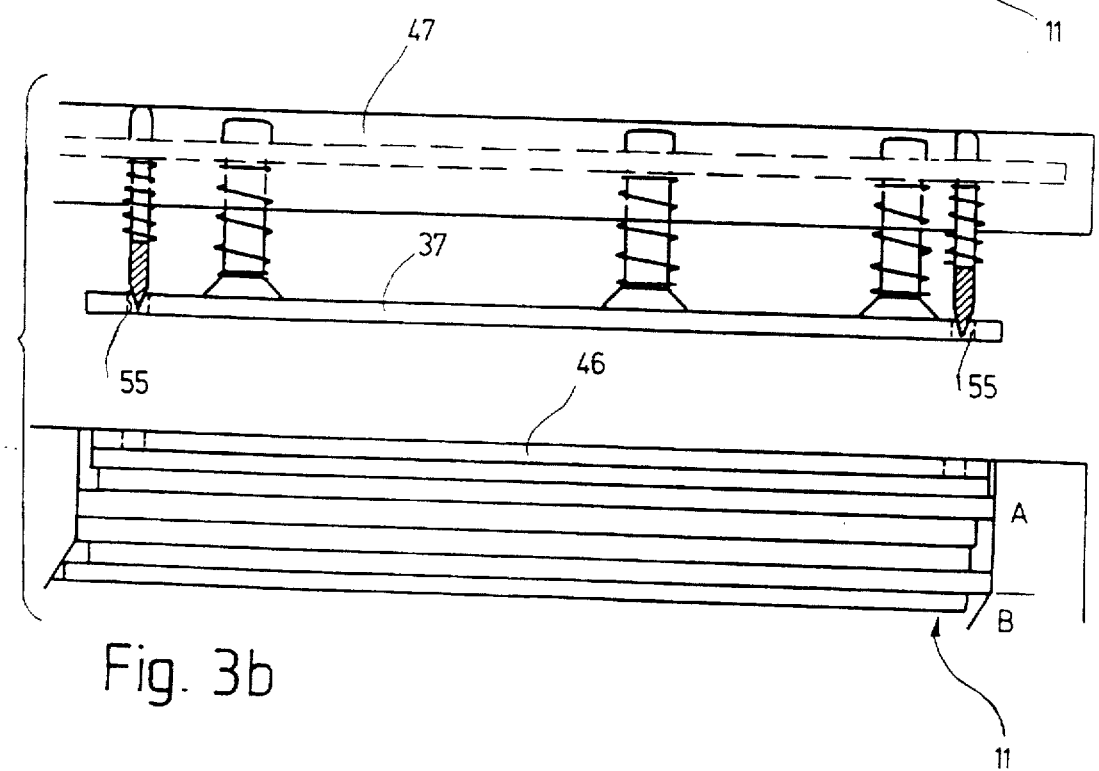

In both FIGS. 3a and 3b, the printed circuit boards are not arranged flush with each other in the region "A" of the side surface 39 of the guide head 29. This means that no fine adjusting takes place in this region. However, the cooperation of the slide 31 and the guide head 29 should insure a rough aligning, so that in each case it is insured that the positioning mandrels 49 engage in the positioning holes 55. The offset of the upper printed circuit board with respect to its optimal position can thus be within allowable limits which corresponds to about half of the diameter of the positioning hole. This makes possible to have greater tolerances of the outer contour of the printed circuit boards.

Figure 3C:
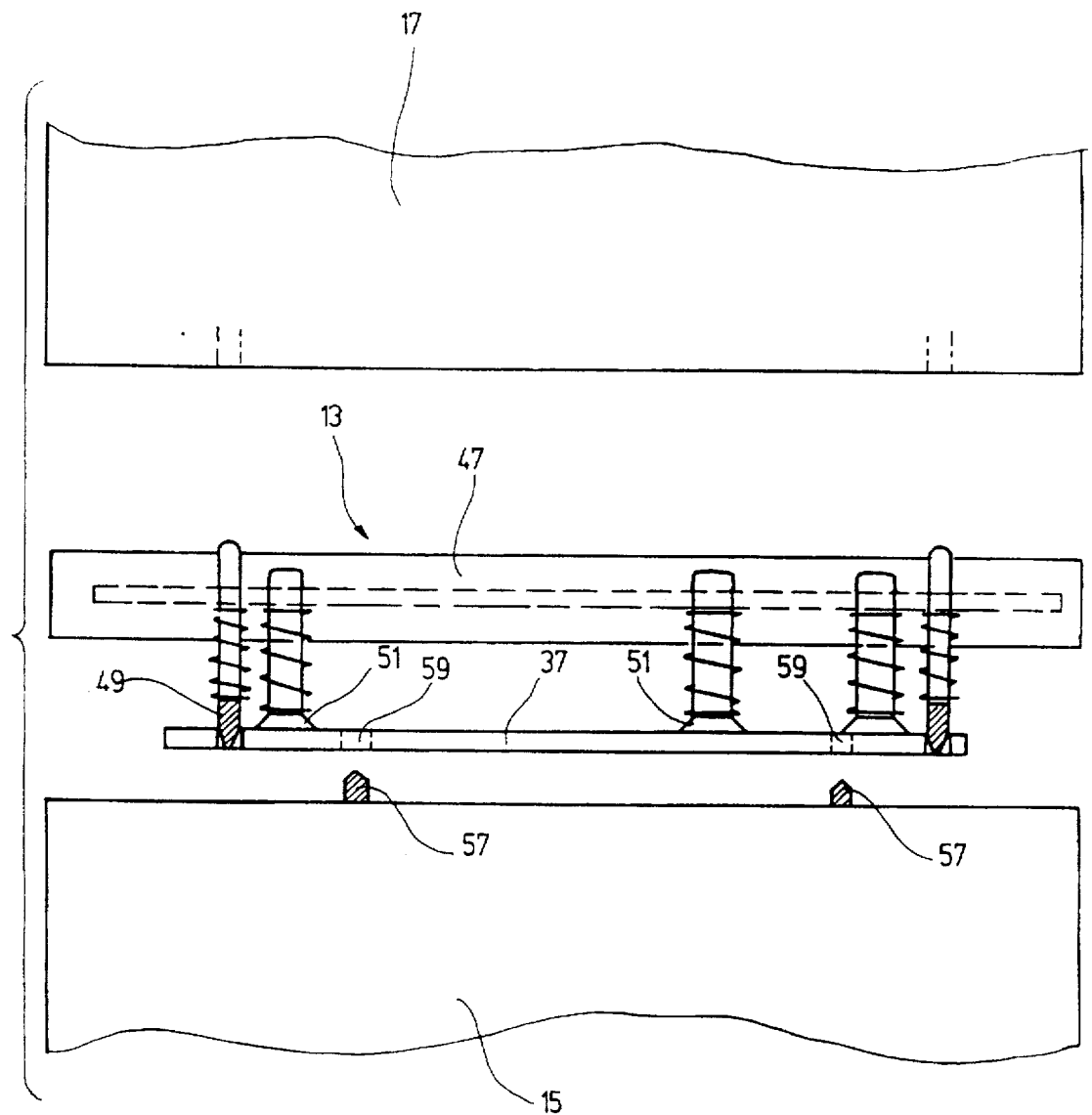

The lifted-off printed circuit board is transported into the test region 5 as shown in FIG. 3c. The transporter 13 brings the printed circuit board into a position in which further holes 59 in the printed circuit board 37 are located above the positioning mandrels 57 of the test adapter 15. Upon lowering of the printed circuit board 37, the positioning mandrels 57 engage in the corresponding holes 59, so that the printed circuit board 37 occupies a predetermined position. Then, the vacuum suction members 51 are deactuated, with the printed circuit board 57 being supported on the test adapter 15. The transporter 13 travels back in the region 3 for lifting off and transporting the following printed circuit board.

When the transporter 13 leaves the region 5, the test adapter 17 is lowered onto the printed circuit board 37, and the testing starts. After the test is completed, the second transporter 19, which is formed similar to the transporter 13, lifts the tested printed circuit board dependent on the test results, to a "Defect box" in the region 7 or to the storing region 9 where a stack 61 of the tested printed circuit boards is formed.

The above-described handling apparatus permits the elimination of expensive handling mechanisms used previously.

The inventive apparatus permits the achievement of the precision positioning required in testing.

Because no precise alignment of the storing stack 61 is required, the positioning mandrels can be eliminated in the second transporter.

Though the present invention was shown and described with reference to the preferred embodiments, various modifications thereof will be apparent to those skilled in the art and, therefore, it is not intended that the invention be limited to the disclosed embodiments or details thereof, and departure can be made therefrom within the spirit and scope of the appended claims.

What is claimed is:

1. An apparatus for automatic handling of plate-shaped test pieces, comprising:
   a vertically displaceable lift table on which a stack of plate-shaped test pieces is supported;
   a displaceable slide for horizontally displacing an uppermost test piece relative to an adjacent test piece located immediately below and into a predetermined test piece lift-off position;
   stop means defining the predetermined test piece lift-off position and against which stop means the uppermost test piece is displaced;
   a first transporter for lifting the uppermost test piece off and transporting it into a test position; and
   a second transporter for transporting the tested piece from the test position to a storing position,
   wherein the stop means has a height-dependent profile; and
   wherein the stop means has a stop surface which defines the height dependent-profile and which has at least one surface region extending at an angle to a vertical.

2. An apparatus for automatic handling of plate-shaped test pieces, comprising:
   a vertically displaceable lift table on which a stack of plate-shaped test pieces is supported;
   a displaceable slide for horizontally displacing an uppermost test piece relative to an adjacent test piece located immediately below and into a predetermined test piece lift-off position;
   stop means defining the predetermined test piece lift-off position and against which stop means the uppermost test piece is displaced;
   a first transporter for lifting the uppermost test piece off and transporting it into a test position; and
   a second transporter for transporting the tested piece from the test position to a storing position,
   wherein the first and second transporters comprise replaceable test piece-specific holding and locating means, and
   wherein the holding means of both first and second transporters comprises vacuum suction means.

3. An apparatus for automatic handling of plate-shaped test pieces, comprising:
   a vertically displaceable lift table on which a stack of plate-shaped test pieces is supported;
   a displaceable slide for horizontally displacing an uppermost test piece relative to an adjacent test piece located immediately below and into a predetermined test piece lift-off position;
   stop means defining a predetermined test piece lift-off position and against which stop means the uppermost test piece is displaced;
   a first transporter for lifting the uppermost test piece off and transporting it into a test position; and
   a second transporter for transporting the tested piece from the test position to a storing position, wherein the first and second transporters comprise replaceable test piece-specific holding and locating means, and
   wherein the locating means of the first transporter comprises positioning mandrels which engage respective holes provided in the test piece.

* * * * *